United States Patent [19]

Namiki et al.

[11] Patent Number: 5,302,468
[45] Date of Patent: Apr. 12, 1994

[54] ORGANIC ELECTROLUMINESCENT DISPLAY APPARATUS

[75] Inventors: Tohru Namiki; Hitoshi Sato; Kenichi Nagayama; Teruichi Watanabe, all of Tsurugashima, Japan

[73] Assignee: Pioneer Electronic Corporation, Tokyo, Japan

[21] Appl. No.: 921,128

[22] Filed: Jul. 29, 1992

[30] Foreign Application Priority Data

Jan. 28, 1992 [JP] Japan .................... 4-13206

[51] Int. Cl.$^5$ .................... F21K 2/00; H05B 33/06
[52] U.S. Cl. .................... 428/690; 428/917; 313/500; 313/504; 313/505; 313/506
[58] Field of Search ............... 428/690, 917, 620, 623, 428/621, 624, 58, 192; 313/500, 504, 506, 505, 509

[56] References Cited

U.S. PATENT DOCUMENTS

| | | | |
|---|---|---|---|
| 4,528,480 | 7/1985 | Unagami et al. | 313/505 |
| 4,924,144 | 5/1990 | Menn et al. | 313/505 |
| 5,073,446 | 12/1991 | Scozzafava et al. | 313/504 |

FOREIGN PATENT DOCUMENTS

| | | | |
|---|---|---|---|
| 52-58494 | 5/1977 | Japan | 313/505 |
| 954888 | 4/1964 | United Kingdom | 313/506 |

*Primary Examiner*—Alexander S. Thomas
*Assistant Examiner*—Charles R. Nold
*Attorney, Agent, or Firm*—Sughrue, Mion, Zinn, Macpeak & Seas

[57] ABSTRACT

Disclosed is an organic electroluminescent display apparatus that has small panels each constituted by forming light-emitting sections, each comprising an organic electroluminescent layer, a transparent electrode and a metal electrode, on one major surface of the substrate. The transparent electrode has an extending portion formed to continuously extend from one major surface of the substrate to one side surface. The associated transparent electrodes of adjoining small panels are electrically connected via an anisotropic conductive sheet which has a conductivity only in the thickness direction. This design can narrow the non-light emitting area of each joint of the small panels.

3 Claims, 2 Drawing Sheets

ORGANIC ELECTROLUMINESCENT DISPLAY APPARATUS

BACKGROUND OF THE INVENTION

1. Field of the Invention

The present invention relates to an organic electroluminescent (hereinafter referred to as EL) display apparatus comprising organic EL elements which emit light when applied with electric charges.

2. Description of the Related Art

Typically, large display apparatuses comprising organic EL elements have a plurality of organic EL elements. Each EL element has an organic EL layer and a pair of electrodes for applying electric charges to this organic EL layer. The quantity of EL elements is determined in accordance with the number of pixels. The EL elements are formed on a single large substrate of an element to constitute a large screen panel, or, alternatively a small panels each having a predetermined number of organic EL elements formed thereon are stacked together to form a large panel.

The organic EL layer should be formed uniformly over the entire panel surface. In the case where a plurality of organic EL elements are formed on a single large substrate, therefore, it is difficult to form the organic EL layer uniformly over the entire substrate surface. Further, a non-uniformly formed organic EL layer would result in uneven brightness on the screen. In addition to a non-uniformly formed organic EL layer, brightness may occur when a hole carrying layer, an electron carrying layer, or electrodes are formed unevenly.

In the case where a plurality of small panels are stacked together to form a large panel, the organic EL layer of each panel can be formed uniformly so that uneven brightness can be suppressed when the large panel is formed. Since the individual electrodes of the organic EL element are very thin, about 1000 angstroms, however, the electrodes to be connected have narrow connecting faces. This makes it difficult to connect the associated electrodes of the adjoining small panels at their end portions.

Conventionally, only the electrodes are led out from each panel to connect the electrodes to thereby facilitate the connection of the panels. This method inevitably increases the joint portions which do not emit light making the joints prominently darker.

SUMMARY OF THE INVENTION

It is therefore an object of the present invention to provide an organic EL display apparatus which does not have the above shortcoming and which suppresses the prominence of joints at the panel-connected portions created when a plurality of small panels are connected to form a large panel.

To achieve this object, according to the present invention, there is provided an organic EL display apparatus which comprises a plurality of organic EL element assemblies having light-emitting sections each including an organic EL layer and a pair of a transparent electrode and a metal electrode facing each other with the organic EL layer in between, and a substrate for supporting at least one of the light-emitting sections on one major surface, the plurality of organic EL element assemblies being arranged adjacent to one another in such a way that the associated transparent electrodes of the adjoining organic EL element assemblies are electrically connected to one another and the associated metal electrodes thereof are electrically connected to one another, each of the transparent electrode and metal electrode having an extending portion continuously formed from the one major surface of the substrate to a side surface thereof, whereby the associated transparent electrodes and metal electrodes of the adjoining organic EL element assemblies are electrically connected together at the extending portions through a first anisotropic conductive adhesive layer having a conductivity only in a thickness direction.

In another embodiment, the organic EL display apparatus further comprises a transparent substrate for supporting the plurality of organic EL element assemblies arranged adjacent to one another, and the extending portion of the transparent electrode extends to the other major surface of the substrate, the transparent substrate having a conductive portion formed thereon for electrically connecting the extending portions of the associated transparent electrodes of the adjoining organic EL element assemblies and a second anisotropic conductive adhesive layer formed thereon for connecting the conductive portion with the extending portions of the associated transparent electrodes.

The organic EL display apparatus according to the present invention can allow the associated transparent electrodes and metal electrodes of the adjoining organic EL element assemblies to be surely and firmly connected to one another.

DETAILED DESCRIPTION OF THE PREFERRED EMBODIMENTS

Organic EL display apparatuses embodying the present invention will be described below referring to the accompanying drawings.

First, an organic EL display apparatus according to a first embodiment will be described referring to FIGS. 1 through 4.

Figure 1:
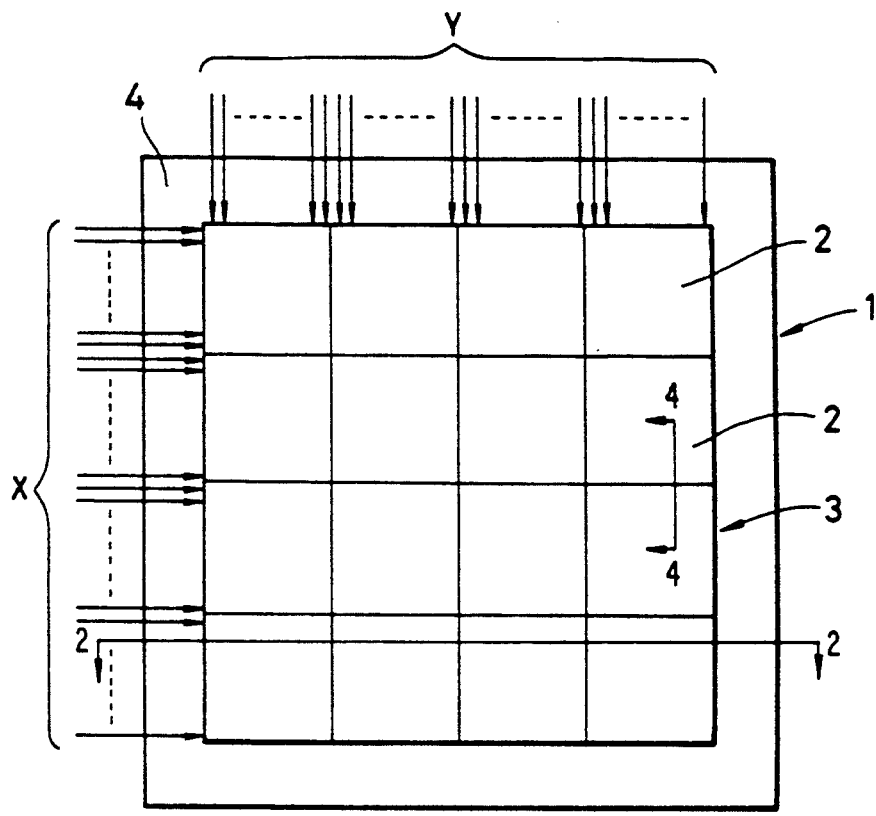
FIG. 1 is a diagram illustrating the structure of an organic EL display apparatus according to a first embodiment of the present invention.
Figure 2:
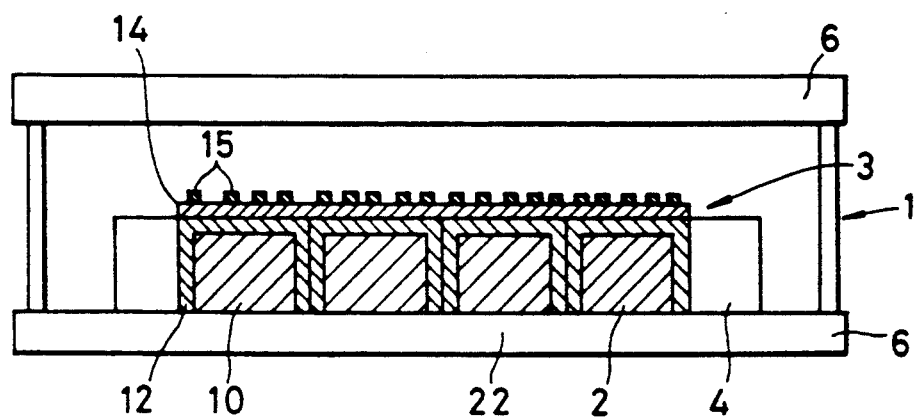
FIG. 2 is a cross section taken along the line 2—2 in FIG. 1.

Referring to FIGS. 1 and 2, an organic EL display apparatus 1 has a large panel 3 of the desired screen size, which is formed by arranging, for example, 16 small panels 2 as organic EL element assemblies in a 4 by 4 matrix form and electrically connecting them together. This large panel 3, with a drive device 4 attached to the periphery thereof, is housed in a casing 6 and is disposed on a transparent substrate 22 of transparent glass, which becomes a display surface.

Figure 3:
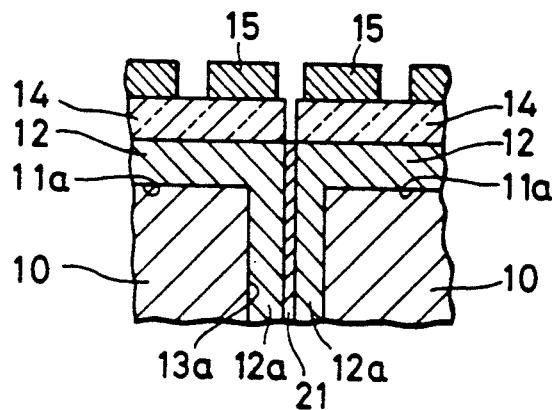
FIG. 3 is a cross section of a connecting portion of adjoining organic EL element assemblies in FIG. 2.
Figure 4:
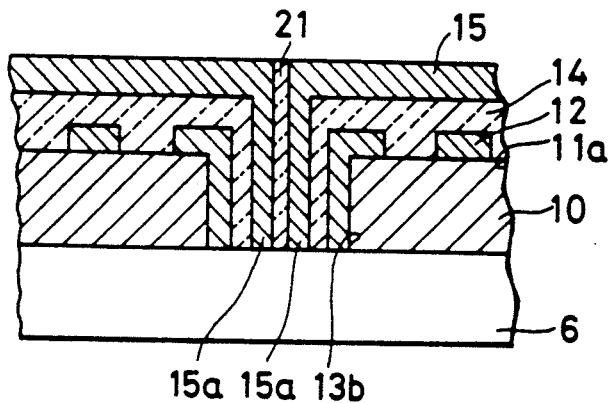
FIG. 4 is a cross section taken along the line 4—4 in FIG. 1.

Each small panel 2 has organic EL elements formed thereon for 20,000 pixels, for example. As shown in FIGS. 3 and 4, each small panel 2 has a plurality of belt-shaped transparent electrodes 12 of ITO (indium tin oxide) formed in parallel on one major surface 11a of a rectangular substrate 10, which is made of a transparent and insulating material, such as glass. The substrate 10 has a pair of facing major surfaces 11a and 11b, and four side surfaces 13a, 13b, 13a, and 13b which connect those major surfaces 11a and 11b. Of the four side surfaces, the side surfaces 13a and 13a face each other in parallel, and the side surfaces 13b and 13b face each other in parallel. Each transparent electrode 12 has an extending portion 12a which continuously extends in the lengthwise direction from the major surface 11a of the substrate 10 to the side surface 13a. An organic EL layer 14 made of an organic material is formed on the transparent electrodes 12 over the entire major surface 11a of the substrate 10.

As shown in FIGS. 3 and 4, a plurality of belt-shaped metal electrodes 15 are formed in parallel on this organic EL layer 14, each having a lengthwise direction defined as a direction crossing the lengthwise direction of the associated transparent electrode 12. Each metal electrode 15 has an extending portion 15a which continuously extends in the lengthwise direction from the major surface 11a of the substrate 10 to the side surface 13b.

In each small panel 2, therefore, the extending portions 12a of the transparent electrodes 12 are formed on one side surface pair 13a of the substrate 10, and the extending portions 15a of the metal electrodes 15 on the other side surface pair 13b.

The organic EL layer 14 and the transparent electrode 12 and metal electrode 15, which make a pair and face each other with the organic EL layer 14 in between, constitute a light-emitting section as an organic EL element. One pixel is formed with the light-emitting section in the vicinity of where each transparent electrode 12 crosses the associated metal electrode 15 while facing each other, taken as one unit.

On each metal electrode 15 may be formed a protective layer for protecting the metal electrode 15 and preventing the short-circuiting of the adjoining metal electrode 15.

The a plurality of small panels 2 are arranged in such a way that the extending portions 12a of the transparent electrodes 12 of the adjoining small panels 2 face each other at the opposite side surfaces 13a of the adjoining small panels 2, and the extending portions 15a of the metal electrodes 15 face each other at the opposite side surfaces 13b of the adjoining small panels 2. An anisotropic conductive sheet 21 as a first anisotropic conductive adhesive layer, which has a conductivity only in the thickness direction is sandwiched between the extending portions 12a and 15a to electrically and securely connect the extending portions 12a and 15a when heated or pressed, for example.

This anisotropic conductive sheet 21 is a film which has, for example, conductive particles almost uniformly dispersed in an adhesive and has, for example, a thin insulating film coated on the individual conductive particles so as to have a conductivity only in the direction of the film thickness while being insulative in the direction perpendicular to the thickness direction. Referring to FIGS. 3-4, the anisotropic layer 21 has conductivity in only the one direction, i.e., a horizontal direction. In other words, a current in the anisotropic layer cannot pass in any direction except the horizontal direction. Accordingly, the anisotropic layer in FIG. 3 prevents one extending portion 12a of the electrode 12 from connecting electrically to the adjoining extending portion 12a (not shown) on the same lateral surface 13a as the former. Similarly, in FIG. 4, one extending portion 15a of electrode 15 is electrically insulated from the adjoining extending portion 15a (not shown) on the same lateral surface 13b as the former.

In FIG. 3, however, the anisotropic layer 21 causes one extending portion 12a of one lateral side 13a of the left side to connect electrically to the extending portion 12a of the right side. In other words, the extending portions 12a and 12a facing each other through the anisotropic layer 21 are electrically connected together. In FIG. 4, similarly, the extending portion 15a and 15a facing each other through the anisotropic layer are electrically connected.

The large panel 3 is formed in the above manner, and the drive device 4 for controlling the individual transparent electrodes 12 and metal electrodes 15 in a matrix form is electrically connected to this large panel 3.

In the organic EL display apparatus 1 having the above structure, the associated electrodes 12 of the adjoining small panels 2 ar electrically connected to one another via the extending portions 12a of those electrodes 12 and the anisotropic conductive sheet 21, and the associated electrodes 15 of the adjoining small panels 2 are likewise electrically connected via their extending portions 15a and the anisotropic conductive sheet 21. This design can provide wider planar space for the connecting portion of the electrodes 12 or the electrodes 15. It is therefore possible to reduce the positioning accuracy at the time of connecting the associated electrodes 12 and 15 of the adjoining small panels 2 as compared with the prior art, thus facilitating the connection of the associated electrodes 12 or electrodes 15 to one another. In addition, the wider planar area of the connecting portion of the electrodes 12 or 15 can provide sure electric connection between the electrodes 12 or 15 and can make the electric connection stronger against the external force.

Further, the extending portions 12a or 15a of the electrodes 12 or 15 on the side surface 13a or 13b of the adjoining small panels 2 can be connected together via the thin anisotropic conductive sheet 21. The non-light emitting area of the joint of the small panels 2 can therefore be made narrower than the one in the prior art, suppressing the prominence of the joint of the small panels 2.

Furthermore, if, as shown in FIG. 4, the transparent electrode 12 at the edge portion of the substrate 10 is formed wide enough to extend to the side surface 13b of the substrate 10, and the extending portion 15a of the metal electrode 15 is formed to extend over the area where the organic EL layer 14 is formed on the transparent electrode 12 on the side surface 13b, the joint of the small panels 2 where the associated metal electrodes 15 face each other can also emit light.

A second embodiment of the present invention will now be described referring to FIG. 5.

Figure 5:
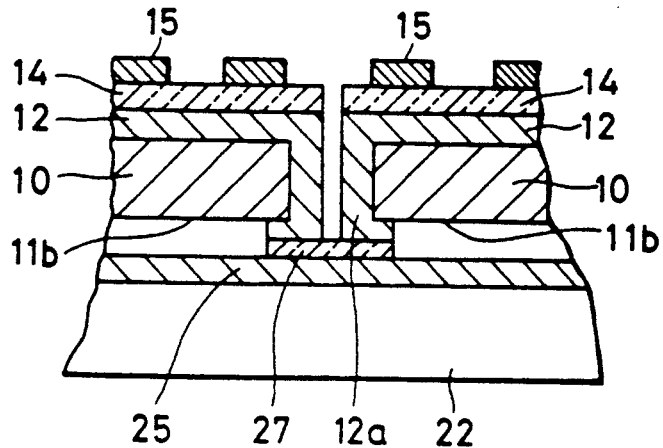
FIG. 5 is a cross section illustrating a connecting portion of adjoining organic EL element assemblies of an organic EL display apparatus according to a second embodiment of the present invention.

In FIG. 5, the extending portions 12a of the transparent electrodes 12 of each small panel 2 are formed to extend from one major surface 11a of the substrate 10 to the other major surface 11b via the side surface 13a. The same reference numerals as used for the components of the first embodiment will be given to corresponding or identical components in the second embodiment to avoid repeating their description.

The small panels 2 are arranged in a matrix form in such a way that the associated transparent electrodes 12 of the adjoining small panels 2 face each other, the associated metal electrodes 15 facing each other, and the other major surface 11b of the substrate 10 is arranged to face the transparent substrate 22 that becomes the display surface of the casing 6.

On the transparent substrate 22 is formed a conductive portion 25 made of a transparent material, such as ITO. This conductive portion 25 simultaneously faces the extending portions 12a of the transparent electrodes 12 which are located on the other major surface 11b of each substrate 10 and are electrically connected.

An anisotropic conductive sheet 27 similar to the one used in the first embodiment is sandwiched as a second anisotropic conductive adhesive layer between the substrate 10 and the transparent substrate 22 to securely and electrically connect the extending portions 12a of the transparent electrodes 12 and the conductive portion 25 when heated or pressed.

The large panel 3 is formed in this manner.

In this organic EL display apparatus 1, at the time the associated electrodes 12 or 15 of the adjoining small panels 2 are electrically connected to one another, the extending portions 12a of the transparent electrodes 12 on the other major surface 11b of the substrates 10 of the small panels 2 are electrically connected to the conductive portion 25 of the transparent substrate 22 via the anisotropic conductive sheet 27. This design can provide wider planar space for the connecting portion of the adjoining small panels 2. The adjoining small panels 2 can thus be connected electrically by arranging the small panels 2 at given positions on the transparent substrate 22, connecting the associated transparent electrodes 12 together via this transparent substrate 22, and connecting the associated metal electrodes 15 together as shown in FIG. 4. It is therefore possible to reduce the positioning accuracy at the time of connecting the associated electrodes 12 and 15 of the adjoining small panels 2 as compared with the prior art, thus facilitating the connection of the associated electrodes 12 or electrodes 15 to one another. In addition, the electrical connection between the transparent electrodes 12 can be accomplished surely and firmly.

Because the anisotropic conductive sheets 21 and 27 show their conductivity only in the thickness direction, they may be formed in a tape shape whose lengthwise direction is the direction of the joint of the substrates 10.

Although the embodiments of the present invention have been illustrated to have the organic EL layer and electrodes in the foregoing description, they may have a hole carrying layer or an electron carrying layer.

In short, according to the organic EL display apparatus embodying the present invention, the electrodes of the light-emitting section each have an extending portion continuously extending from one major surface of the substrate to one side surface, so that the associated electrodes of the adjoining organic EL element assemblies are electrically connected at the extending portions via a first anisotropic conductive adhesive layer that has a conductivity only in the thickness direction. This design can provide wider planar space for the connecting portion of the electrodes. It is therefore possible to facilitate the electric connection between the associated electrodes of the adjoining organic EL element assemblies.

Further, according to a modification of the organic EL display apparatus of the present invention, a transparent substrate for supporting a plurality of organic EL element assemblies arranged adjacent to one another is provided and the extending portions of the transparent electrodes are formed to continuously extend to the other major surface of the substrate, and a conductive portion facing the extending portions of the associated transparent electrodes of the adjoining organic EL element assemblies and a second anisotropic conductive adhesive layer for connecting this conductive portion and the extending portions are formed on the transparent substrate. This design can facilitate the electric connection of the associated electrodes of the adjoining organic EL element assemblies. In addition, since the side surfaces of the adjoining organic EL element assemblies can be made to directly contact each other, it is possible to prevent the joint portions of the organic EL element assemblies from becoming darker, thus suppressing the prominence of the joint portions.

The above descriptions are intended by way of example only and is not intended to limit the present invention in any way except as set forth in the following claims.

What is claimed is:

1. An organic electroluminescent display apparatus comprising:
   a plurality of organic electroluminescent element assemblies having light-emitting sections each including an organic electroluminescent layer, a transparent electrode and a metal electrode facing each other with said organic electroluminescent layer in between,
   a substrate having a first major surface for supporting at least one of the light-emitting sections, said plurality of organic electroluminescent element assemblies being arranged adjacent to one another such that each said transparent electrode of said adjoining organic electroluminescent element assemblies is electrically connected to one another and each said metal electrode of said adjoining organic electroluminescent element assemblies is electrically connected to one another,
   each said transparent electrode and said metal electrode having at least one extending portion continuously formed from said first major surface of said substrate to a side surface thereof; and,
   a first anisotropic conductive adhesive layer electrically connecting said transparent electrodes of said adjoining organic electroluminescent element assemblies at the extending portions, said first anisotropic conductive adhesive layer electrically connecting said metal electrodes of said adjoining organic electroluminescent element assemblies at the extending portions, and said first anisotropic conductive adhesive layer having conductivity only in a direction substantially normal to the surface of the extending portions.

2. The organic electroluminescent display apparatus according to claim 1, further comprising:
   a transparent substrate for supporting said plurality of organic electroluminescent element assemblies arranged adjacent to each other, wherein said extending portion of said transparent electrode extends to a second major surface of said substrate;
   a conductive portion formed on said transparent substrate for electrically connecting said extending portions of each of said transparent electrodes of said adjoining organic electroluminescent element assemblies; and
   a second anisotropic conductive adhesive layer formed on said conductive portion for connecting the conductive portion and said extending portions of said transparent electrodes.

3. An organic electroluminescent display apparatus comprising:

a plurality of organic electroluminescent element assemblies having light-emitting sections each including an organic electroluminescent layer, a transparent electrode and a metal electrode facing each other with said organic electroluminescent layer in between;

a substrate having a first major surface for supporting at least one of the light-emitting sections, said plurality of organic electroluminescent element assemblies being arranged adjacent to one another such that each said transparent electrode of said adjoining organic electroluminescent element assemblies is electrically connected to one another and each said metal electrode of said adjoining organic electroluminescent element assemblies is electrically connected to one another;

each said transparent electrode and said metal electrode having at least one extending portion continuously formed from said first major surface of said substrate to a side surface thereof;

a transparent substrate for supporting said plurality of organic electroluminescent element assemblies arranged adjacent to each other, wherein said extending portion of said transparent electrode extends to a second major surface of said substrate;

a conductive portion formed on said transparent substrate for electrically connecting said extending portions of each of said transparent electrodes of said adjoining organic electroluminescent element assemblies; and an anisotropic conductive adhesive layer formed on said conductive portion for connecting the conductive portion and said extending portions of said transparent electrodes.

* * * * *